United States Patent [19]

Imanaka

[11] Patent Number: 5,038,097
[45] Date of Patent: Aug. 6, 1991

[54] SPECTRUM ANALYZER

[75] Inventor: Noritoshi Imanaka, Hachiohji, Japan

[73] Assignee: Kabushiki Kaisha Kenwood, Tokyo, Japan

[21] Appl. No.: 421,114

[22] Filed: Oct. 13, 1989

[30] Foreign Application Priority Data

Oct. 18, 1988 [JP] Japan ............... 63-260574

[51] Int. Cl.⁵ .................................. G01R 23/16
[52] U.S. Cl. ..................................... 324/77 B
[58] Field of Search ............... 340/721, 722, 728, 729, 340/734; 324/77 R, 77 B, 77 G

[56] References Cited

U.S. PATENT DOCUMENTS

| | | | |
|---|---|---|---|
| 3,700,801 | 10/1972 | Dougherty | 324/77 G |
| 3,701,091 | 10/1972 | Lenihan | 324/77 R |
| 4,455,613 | 6/1984 | Shoemaker | 324/77 R |
| 4,464,656 | 8/1984 | Nakamura | 340/728 |
| 4,797,923 | 1/1989 | Clarke | 324/77 B |
| 4,802,098 | 1/1989 | Hansen et al. | 324/77 B |

Primary Examiner—Michael J. Tokar
Attorney, Agent, or Firm—Sixbey, Friedman, Leedom & Ferguson

[57] ABSTRACT

A spectrum analyzer includes an arithmetic operation unit for calculating an interpolated value of two sample levels of the signals passed through two band-pass filters having center frequencies near to each other. The interpolated value levels calculated by the arithmetic calculation unit sequentially are displayed at positions between respective two sample signal levels.

6 Claims, 4 Drawing Sheets

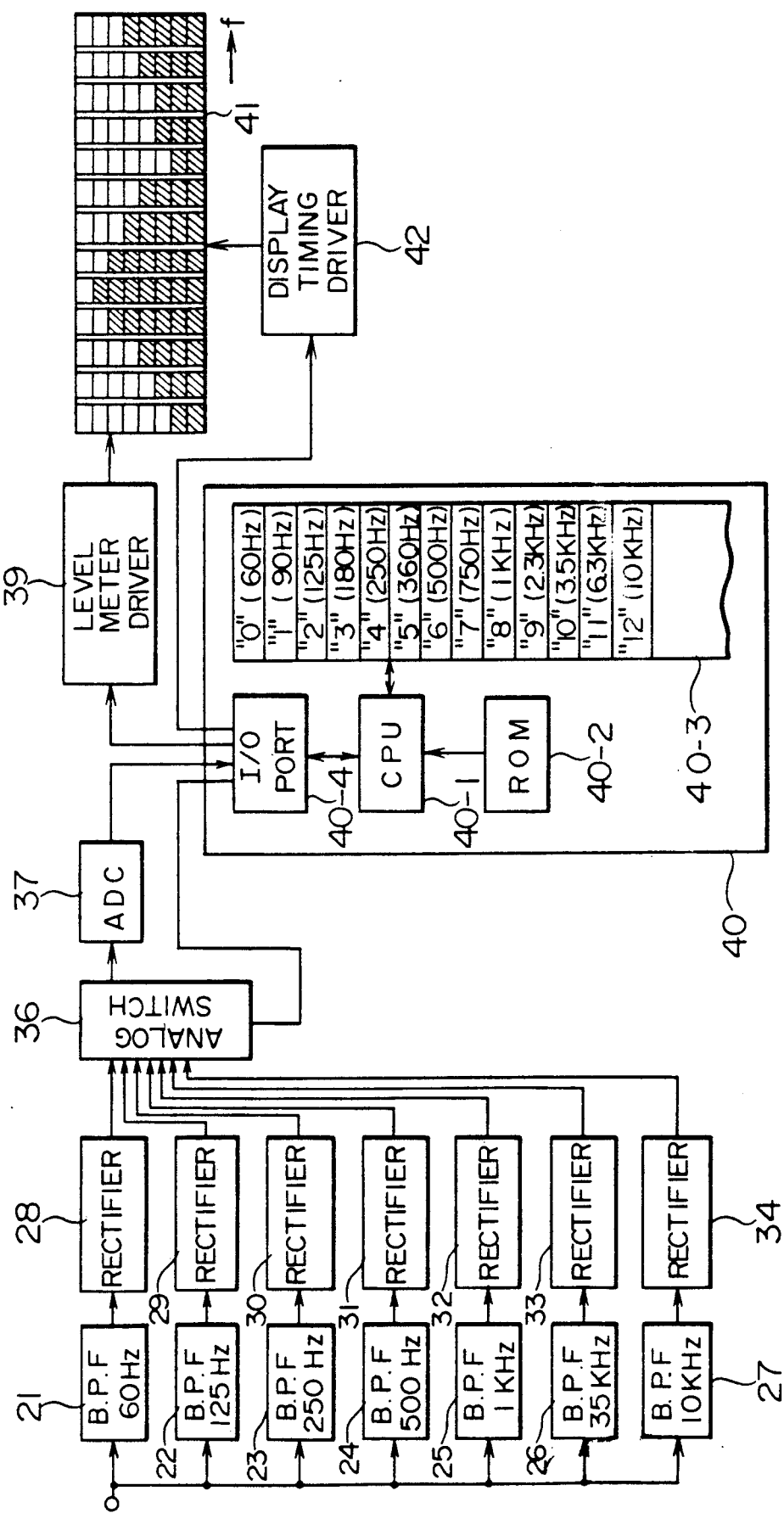

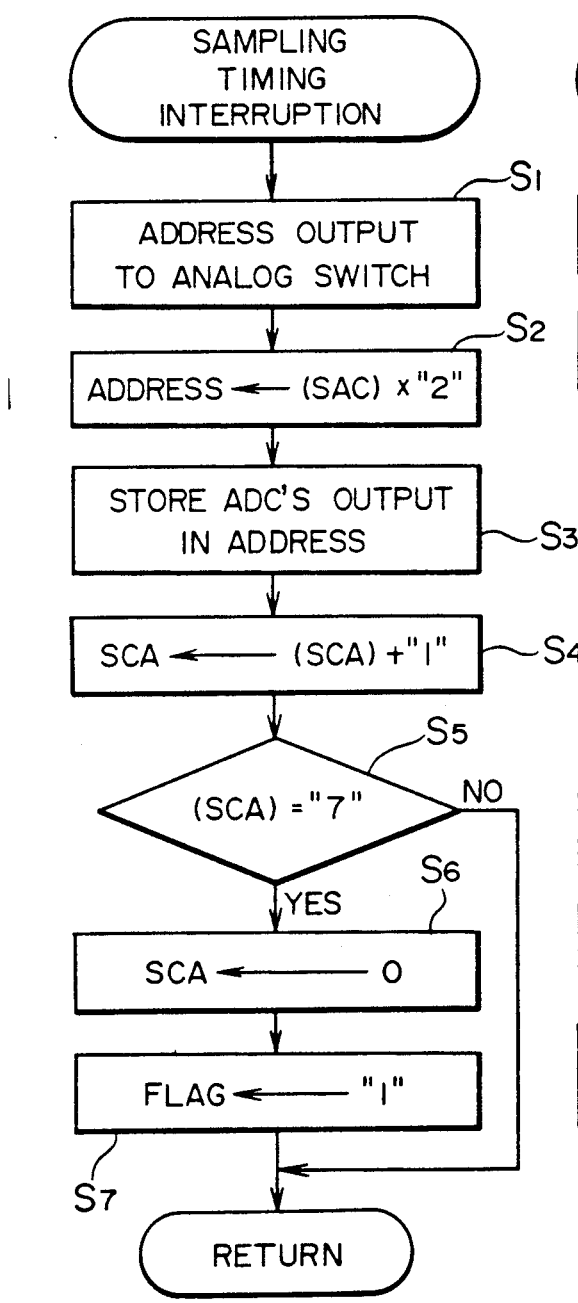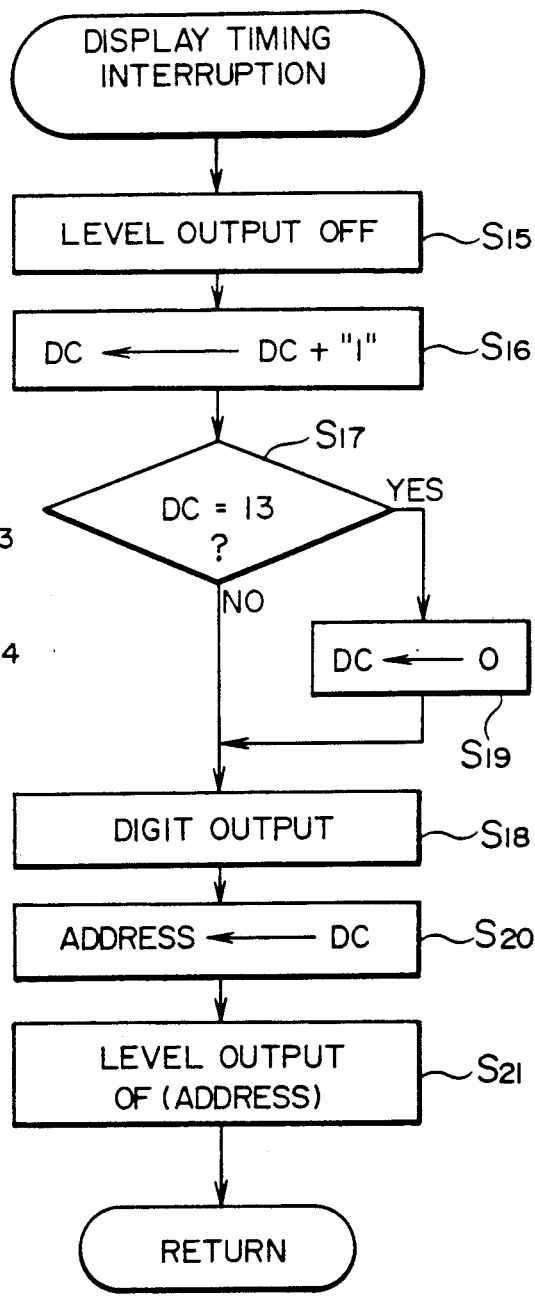

SPECTRUM ANALYZER

BACKGROUND OF THE INVENTION

1. Field of the Invention

The present invention relates to a spectrum analyzer, particular an indicator mounted on a sound reproducing apparatus or the like.

2. Description of Related Background Art

A conventional spectrum analyzer of this type, shown in FIG. 5 by way of example, displays a frequency spectrum in the following manner. An input signal is supplied to a plurality of band-pass filters 21 to 27 each having a different center frequency. The outputs of the band-pass filters 21 to 27 are supplied to, and rectified by, associated rectifiers 28 to 34. The rectified outputs from the rectifiers 28 to 34 are sequentially sampled by an analog switch circuit 36 in synchro with timing signals from a timing signal generator 35, and converted into digital data by an A/D converter 37. The digital data are displayed on a level meter 38 as a bar graph in synchro with the timing same as that used for the analog switch 36. In FIG. 5, reference number 40 represents a level meter driver, and 40 represents a timing driver which receives a timing signal from the timing signal generator 35, and synchronizes the timing when each bar is displayed on the level display 38, with the timing used for switching the analog switch 36.

In displaying a frequency spectrum on a spectrum analyzer, the afterimage effect of human eyes is utilized. Generally, a visually proper frequency spectrum can be displayed if the analog switch 36 is switched at the sampling period of several tens to several hundreds Hz.

There is also known a spectrum analyzer using a microcomputer or the like, wherein A/D converted level data are stored in a temporary memory and displayed on a level meter at the different timing from the sampling timing used for the analog switch 36.

In order to display a visually smooth response-frequency curve on a spectrum analyzer, it has been necessary to make the number of frequency divisions large. The number of band-pass filters, rectifiers increase correspondingly, and a large scale analog switch is used. The space for these circuit elements of the spectrum analyzer becomes large, and the spectrum analyzer becomes expensive.

It is therefore an object of the present invention to provide a spectrum analyzer capable of providing a large number of frequency divisions with a small number of band-pass filters.

SUMMARY OF THE INVENTION

The above object of the present invention can be achieved by providing a spectrum analyzer comprising: a plurality of band-pass filters each having a different center frequency; detection means for detecting the level of a signal passed through each said band-pass filter; arithmetic operation means for calculating an interpolated value of two levels of the signals passed through two band-pass filters having center frequencies near to each other; and a level meter for displaying the signal levels detected by the detection means sequentially in the ascending order of the center frequencies of the band-pass filters, and for displaying the interpolated value levels calculated by the arithmetic calculation means sequentially at positions between respective two signal levels on the basis of which each of the interpolated value levels was calculated; to thereby time sequentially display the level-frequency distribution of an input signal including both the signal levels and calculated interpolated value levels.

According to the spectrum analyzer of this invention, an interpolated value of two levels of the signals passed through two band-pass filters having center frequencies near to each other is calculated by the arithmetic calculation means. The signal levels detected by the detection means are displayed on the level meter sequentially in the ascending order of the center frequencies of the band-pass filters, and the interpolated value levels calculated by the arithmetic calculation means are also displayed on the level meter sequentially at positions between respective two signal levels on the basis of which each of the interpolated value levels was calculated.

Accordingly, if n band-pass filters are used, the number of interpolated values is (n−1). The level meter can thus use a maximum number of frequency divisions (2n−1) while necessitating only n band-pass filters.

BRIEF DESCRIPTION OF THE DRAWINGS

The above and other objects and features of the present invention will become more apparent from the following description when read in conjunction with the accompanying drawings, in which:

FIG. 1 is a block diagram showing the structure of an embodiment of the spectrum analyzer according to the present invention;

FIG. 2a 2b and 2c show flow charts used for explaining the operation of the embodiment shown in FIG. 1;

DETAILED DESCRIPTION OF THE PREFERRED EMBODIMENT

The invention will be described in more detail in connection with a preferred embodiment.

FIG. 1 is a block diagram showing the structure of the embodiment of this invention.

An input signal is supplied to band-pass filters 21 to 27 having center frequencies 60 Hz, 125 Hz, 250 Hz, 500 Hz, 1kHz, 3.5 kHz and 10 kHz, respectively. The separated outputs of the band-pass filters 21 to 27 are supplied to associated rectifiers 28 to 34 which output corresponding d.c. voltages.

Figure 3:
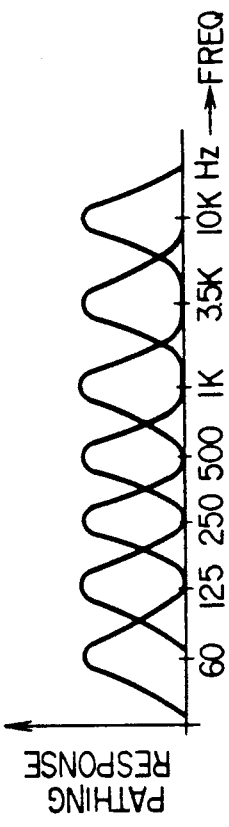
FIG. 3 is a diagram showing an example of the characteristics of the band-pass filters 21 to 27.
Figure 4:
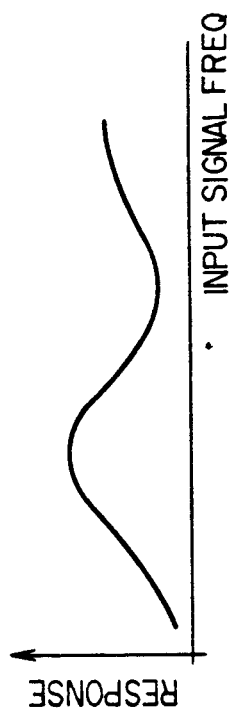
FIG. 4 is a diagram showing the response-frequency characteristic of an input signal.

The response-frequency of an input signal is shown in FIG. 4 by way of example, and an example of the characteristics of the band-pass filters 21 to 27 is shown in FIG. 3.

The outputs of the band-pass filters 21 to 27 rectified by the rectifiers 28 to 34 are sequentially selected by, and outputted from, an analog switch 36, and supplied to an analog/digital (referred to as A/D) converter 37 to convert them into digital data.

A microcomputer 40 has a central processing unit 40-1, ROM 40-2 for storing programs, RAM 40-3 for storing data, and input/output port 40-4. The digital data from the A/D converter 37, corresponding to the outputs of the band-pass filters 21 to 27, are sequentially outputted from the analog switch 36 by supplying thereto a switch signal via the input/output port 40-4. The digital data are then stored in RAM 40-3 at predetermined addresses, e.g., even number addresses among addresses "0" to "12". Under control of the program stored in ROM 40-2, CPU 40-1 calculates average or mean values of data stored in RAM 40-3 at respective two adjacent even addresses among the addresses "0" to "12", and stores the calculated values in RAM 40-3 at off addresses among the addresses "0" to "12". In RAM 40-3 shown in FIG. 1, a numeral within " " represents an address number, and the band-pass center frequency within ( ) is used to represent the stored data outputted from the band-pass filter. Band-pass filters for odd addresses among the addresses "0" to "12" are not provided in actual. The center frequency within ( ) at an odd address is approximately an average frequency of two center frequencies of the two adjacent band-pass filters at even addresses on both sides of the odd address. The stored contents read from RAM 403 at the addresses "0" to "12" are supplied via the input/output port 40-4 to a level meter driver 39, whereas a display timing signal is supplied via the input/output port 40-4 to a display timing driver 42, to thereby display on a level meter 41 the levels of the data stored in RAM 40-3 at the addresses "0" to "12". The number of frequency divisions in this embodiment is 13.

RAM 40-3 contains therein a sampling address counter area, digit count area, and flag area. The sampling address counter area stores a count which is used as a switch signal of the analog switch 36. The digit count area stores a count which is used as a designation signal for designating a display frequency position on the level meter 41. The flag area stores a flag which is reset when the address "12" is designated and set when the contents of the sampling address counter area are reset.

The operation of the embodiment of this invention will be described in connection with the program stored in ROM as illustrated in the flow chart shown in FIG. 2.

Figure 2A:
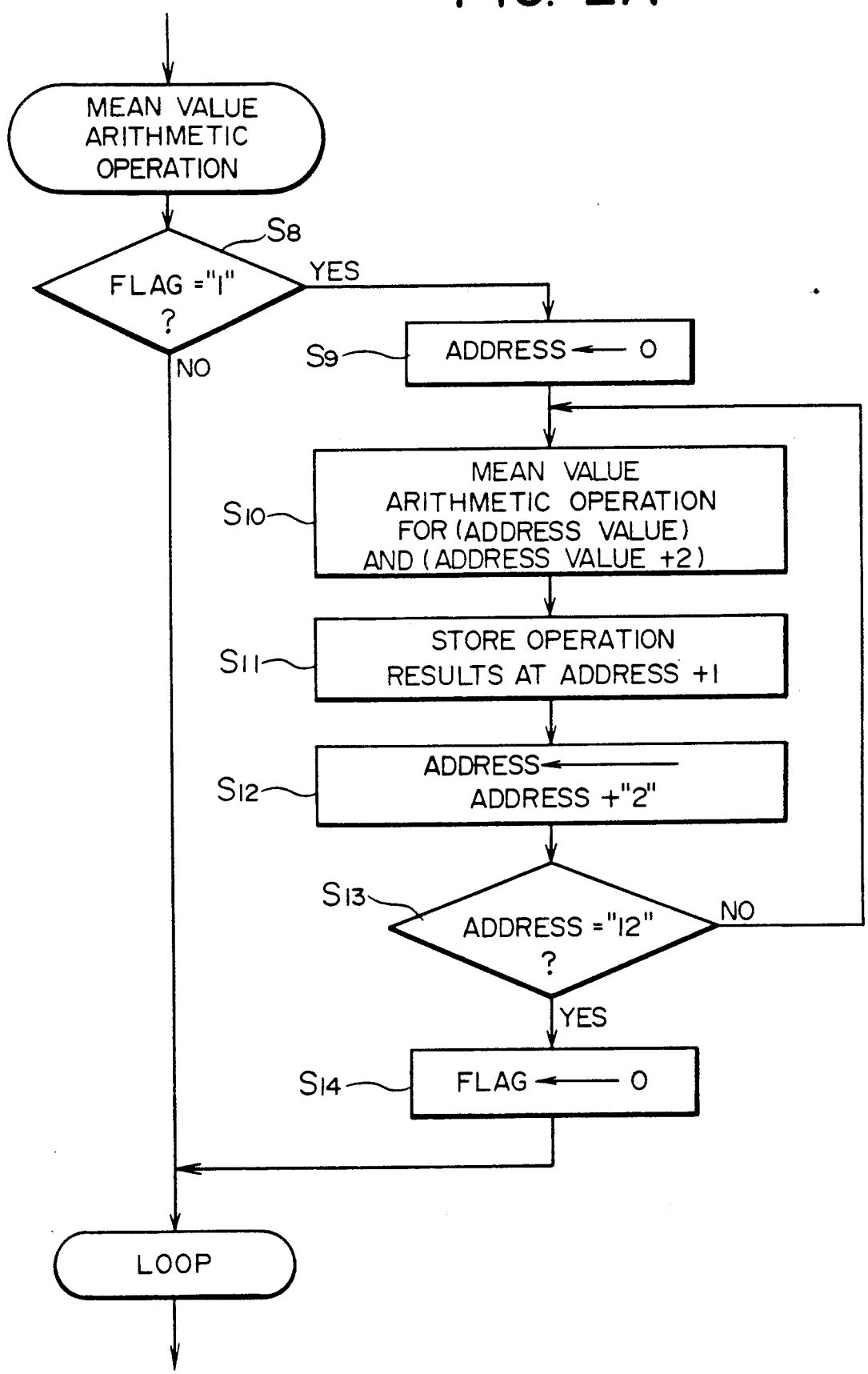
Figure 5:
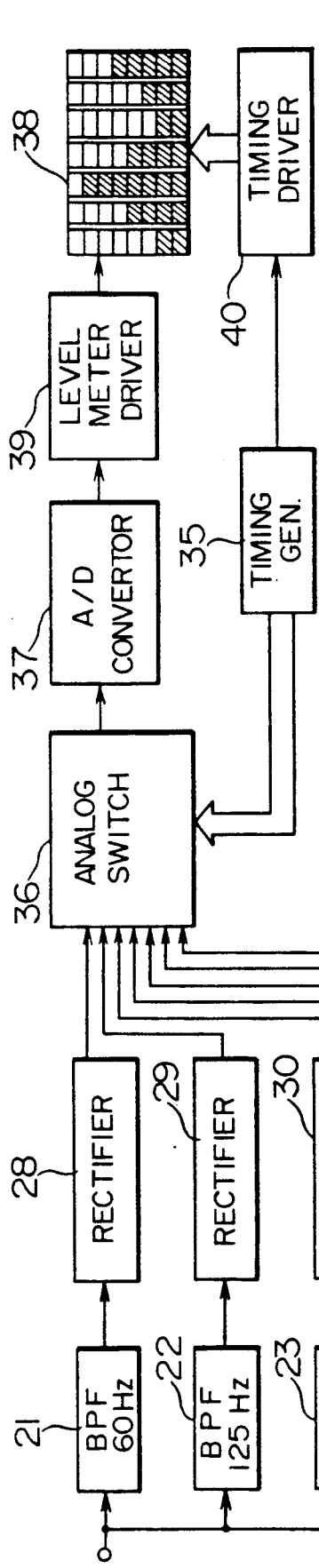
FIG. 5 is a block diagram showing the structure of a conventional spectrum analyzer.

In the flow chart shown in FIG. 2, FIG. 2A illustrates the mean value arithmetic operation processing in the main routine, FIG. 2B illustrates the sampling timing interruption processing, and FIG. 2C illustrates the display timing interruption processing.

Upon reception of a sampling timing interruption during execution of the main routine, a count value in the sampling address counter area is sent to the analog switch 36 as a switch signal (step S1). The count value (indicated at SAC in FIG. 2) in the sampling address counter area multiplied by 2 is stored in an address register which is used for designating an address of RAM 40-3 (step S2). The output from the analog switch 26 is converted into digital data which are stored in RAM 40-3 at an address designated by the set value in the address register (step S3). The count value in the sampling address counter area is incremented by "+1" (step S4). It is checked if the count value in the sampling address counter area is "7" or not (step S5). If "7" at step S5, the count value in the sampling address counter area is reset (step S6). Then, the contents in the flag area are set to "1" (step S7) to return to the main routine. If smaller than "7" at step S5, the flow returns from step S5 to step S1. The operations from step S1 to S7 are repeated seven times so that the outputs of the band-pass filters 21 to 27 rectified and converted into digital data are sequentially stored in RAM 40-3 at the even addresses among the addresses "0" to "12".

In the mean value arithmetic operation processing, it is first checked if the contents stored in the flag area are "1" or not (step S9). If "1" at step S9, the contents set in the address register are reset (step S9). The contents in RAM 40-3 at an address indicated by the contents set in the address register are added to the contents in RAM 40-3 at an address indicated by the contents set in the address register plus "2", to then obtain a mean value thereof (step S10). The mean value calculated at step S10 is stored in RAM 40-2 at an address indicated by the contents set in the address register plus "1" (step S11). The contents in the address register are incremented by "+2" (step S12). It is then checked if the contents set in the address register is "12" or not (step S13). If smaller than "12" at step S13, the operations from step S10 to S13 are repeated until the contents set in the address counter become "12". When the contents set in the address counter become "12", the mean values of the contents at respective two adjacent even addresses have been stored in RAM 40-3 at corresponding odd addresses among the addresses "0" to "12".•

If it is judged at step S13 that the contents set in the address register are "12", the contents in the flag area are reset (step S14) to proceed with the execution of the main routine. If it is judged at step S8 that the contents of the flag area are reset, the main routine is also executed after step S8.

Upon reception of a display timing interruption, the output to the level driver 39 is turned off (step S15). Thereafter, the count value stored in the digit count area is incremented by "+1" (step S16). It is checked if the count value in the digit counter is "13" or not (step S17). If smaller than "13" at step S17, the count value in the digit counter area is outputted to the display timing driver 42 (step S18). If "13" at step S17, the count value stored in the digit counter area is reset (step S19) to advance to step S18.

After step S18, the count value in the digit counter area is set in the address register (step S20). The contents stored in RAM 40-3 at an address indicated by the address register are supplied to the level meter driver 39 (step S21) to thereafter return to the main routine. In this manner, every time a display timing interruption is received, the addresses "0" to "12" of RAM 40-3 are identified one after another. The contents stored at the identified address are outputted to the level meter driver 39, and the count value in the digit counter area is outputted to the display timing driver 42. Accordingly, the levels of the outputs from the band-pass filters with center frequencies 60 Hz to 10 kHz as well as the interpolated levels at approximate means frequencies 125 Hz to 6.3 kHz are displayed on the level meter 41, for example, sequentially in the ascending order of the center frequencies of the band-pass filters.

It is therefore possible to display a quasi spectrum of thirteen frequency bands with interpolated mean levels of respective two adjacent band-pass filters, by using only seven band-pass filters.

In the above embodiment, interpolation by arithmetical mean values has been described. Instead of the arithmetical mean values, interpolation by geometrical mean values may also be used.

As appreciated from the foregoing description of this invention, an interpolated value is calculated by using the signal levels passed through two band-pass filters having center frequencies near to each other. The signal levels from the band-pass filters are displayed on the level meter sequentially in the ascending order of the center frequencies of the band-pass filters, and the interpolated value levels are also displayed on the level meter sequentially at positions between respective two signal levels on the basis of which each of the interpolated value levels was calculated. Accordingly, if n band-pass filters are used, the level meter can use a maximum number of frequency divisions (2n−1), to thereby realize a spectrum analyzer having a larger number (approximately twice) of frequency division bands with a smaller number of band-pass filters.

Although the present invention has been fully described by way of the preferred embodiments, it is to be noted that various changes and modifications are possible which should be construed as falling in the scope and spirit of this invention as defined by the appended claims.

What is claimed is:

1. A spectrum analyzer comprising:
   means for taking spectrum samples of an input signal for different frequency bands;
   means for storing the spectrum samples in a first memory, calculating an interpolated spectrum sample from the spectrum samples stored in the first memory for an interpolation frequency band between adjacent said frequency bands and storing the interpolated sample into a second memory;
   means for displaying the levels of spectrum samples and the interpolated spectrum sample stored in the first and second memory as a spectrum of the input signal for said frequency bands and said interpolation frequency band.

2. A spectrum analyzer according to claim 1, wherein said spectrum sample taking means comprises a plurality of band-pass filters each having a different center frequency.

3. A spectrum analyzer comprising:
   sampling means (21-27, 28-34, 36, 37) for taking spectrum samples in an input signal for a predetermined number of different frequency bands,
   displaying means (39, 41, 42) for displaying a spectrum of the input signal on a screen; and
   microcomputer means (40) for running a process of executing stored program to control said sampling means and displaying means, wherein
   said microcomputer means runs an interpolation processing process of producing interpolation spectrum data from sampled spectrum data stored in a memory for interpolation frequency bands between said frequency bands and storing the produced interpolation spectrum data into the memory,
   said microcomputer in response to a sampling timing interrupt signal interrupts said interpolation processing process and runs a sampling interrupt process of controlling said sampling means to take spectrum samples and storing them as sampled spectrum data into the memory, and
   said microcomputer in response to a display timing interrupt signal interrupts said processing process and runs a display interrupt process of controlling said display means by applying the sampled spectrum data and interpolation spectrum data stored in the memory to said display means to display the spectrum according to the stored data in the memory.

4. A spectrum analyzer according to claim 3, wherein said sampling timing interrupt process sets a flag when the sample spectrum data for all the frequency components in the memory are updated, and said processing process conducts interpolation spectrum data producing steps upon the flag being set.

5. A spectrum analyzer according to claim 4, wherein said sampling timing interrupt process in response to one sampling timing interrupt signal takes one spectrum sample and stores said one spectrum sample in the memory.

6. A spectrum analyzer according to claim 3, wherein said display timing interrupt process run in response to one display timing interrupt signal applies one sampled spectrum data or interpolation spectrum data stored in the memory to said display means.

* * * * *